(12) United States Patent
Lin

(10) Patent No.: US 10,570,929 B2
(45) Date of Patent: Feb. 25, 2020

(54) FAN AND METHOD OF MANUFACTURING A FAN

(71) Applicant: Lenovo (Beijing) Limited, Beijing (CN)

(72) Inventor: Liankai Lin, Beijing (CN)

(73) Assignee: Lenovo (Beijing) Limited, Beijing (CN)

( * ) Notice: Subject to any disclaimer, the term of this patent is extended or adjusted under 35 U.S.C. 154(b) by 683 days.

(21) Appl. No.: 15/014,881

(22) Filed: Feb. 3, 2016

(65) Prior Publication Data

US 2017/0108012 A1    Apr. 20, 2017

(30) Foreign Application Priority Data

Oct. 14, 2015    (CN) .......................... 2015 1 0661728

(51) Int. Cl.
| | |
|---|---|
| F04D 29/66 | (2006.01) |
| F04D 25/02 | (2006.01) |
| F04D 29/32 | (2006.01) |
| F04D 29/38 | (2006.01) |
| G06F 1/20 | (2006.01) |
| H05K 7/20 | (2006.01) |

(52) U.S. Cl.
CPC .......... *F04D 29/668* (2013.01); *F04D 25/02* (2013.01); *F04D 29/326* (2013.01); *F04D 29/329* (2013.01); *F04D 29/384* (2013.01); *G06F 1/20* (2013.01); *H05K 7/20172* (2013.01); *F05B 2230/60* (2013.01)

(58) Field of Classification Search
CPC .... F04D 29/663; F04D 29/666; F04D 29/667; F04D 29/668; F04D 29/32; F04D 29/327; F04D 29/328; F05B 2260/96; H05K 7/20136; H05K 7/20172; G06F 1/20
See application file for complete search history.

(56) References Cited

U.S. PATENT DOCUMENTS

| | | | | |
|---|---|---|---|---|
| 4,662,819 | A * | 5/1987 | Lakowske | F04D 29/287 415/129 |
| 5,681,145 | A * | 10/1997 | Neely | F04D 29/328 415/119 |
| 9,039,393 | B2 * | 5/2015 | Duke | F04D 29/666 417/423.1 |

(Continued)

FOREIGN PATENT DOCUMENTS

| | | |
|---|---|---|
| CN | 101743406 A | 6/2010 |
| CN | 104018886 A | 9/2014 |

(Continued)

*Primary Examiner* — Brian P Wolcott
(74) *Attorney, Agent, or Firm* — Ference & Associates LLC

(57) ABSTRACT

One embodiment provides a fan, including: a hub for connection to a motor; and a plurality of blades coupled to the hub, the plurality of blades being mutually diverging from the hub and spaced apart around a common rotating axis, with each of the plurality of blades defining a centroid, wherein at least one blade of the plurality of blades is deviated with respect to a corresponding centroid of the at least one blade to provide a non-uniform arrangement of the plurality of blades while maintaining a respective centroid of the plurality of blades on a common circumference around the common rotating axis. Other aspects are described and claimed.

14 Claims, 3 Drawing Sheets

(56) References Cited

U.S. PATENT DOCUMENTS

| | | | | |
|---|---|---|---|---|
| 9,777,743 B2* | 10/2017 | Yang | ............... | F04D 29/281 |
| 2006/0280596 A1* | 12/2006 | Kim | ............... | A47L 5/22 |
| | | | | 415/119 |
| 2010/0150709 A1 | 6/2010 | Roduner et al. | | |
| 2013/0052021 A1 | 2/2013 | Hayford et al. | | |
| 2014/0127022 A1* | 5/2014 | Cheng | ............... | F04D 29/281 |
| | | | | 416/192 |
| 2014/0241866 A1* | 8/2014 | Smith | ............... | F04D 29/284 |
| | | | | 415/185 |

FOREIGN PATENT DOCUMENTS

| | | |
|---|---|---|
| CN | 104832459 A | 8/2015 |
| CN | 204692177 U | 10/2015 |
| JP | 2011052556 A | 3/2011 |

\* cited by examiner

FAN AND METHOD OF MANUFACTURING A FAN

CLAIM FOR PRIORITY

This application claims priority to Chinese Application No. 201510661728.3, filed on Oct. 14, 2015, which is fully incorporated by reference herein.

FIELD

The subject matter described herein relates to the technical field of mechanical devices, more specifically, it relates to a fan and further relates to an electronic device equipped with the fan.

BACKGROUND

A fan, a common heat-removing device, is generally applied to such electronic devices as a computer, etc. The fan comprises a central disc, blades and a mute ring. The mute ring surrounds the outside of the central disc, and both have the same central point. A gap is formed between the mute ring and the central disc. Both ends of the blades are fixedly connected with the central disc and the mute ring, respectively. The blades and the mute ring are integrally structured.

At present, the distribution of the blades of the fan is designed according to overall design requirements (for example, an air output quantity requirement, an air input quantity requirement and the like) of the fan, while the blades of the integrally designed fan are uniformly distributed. Any blade can be overlapped with other blades after being rotated around the rotating axle of the fan for a certain angle, thereby resulting in easy resonance of the blades in the application process of the fan, influencing the normal work of the fan, and even damaging the fan and shortening the service life. Thus, the technical problems of poor performance and easy damage of the fan caused by resonance of the blades in the fan in the prior art needs to be addressed.

BRIEF SUMMARY

In summary, one aspect provides a fan, comprising: a hub for connection to a motor; and a plurality of blades coupled to the hub, the plurality of blades being mutually diverging from the hub and spaced apart around a common rotating axis, with each of the plurality of blades defining a centroid, wherein at least one blade of the plurality of blades is deviated with respect to a corresponding centroid of the at least one blade to provide a non-uniform arrangement of the plurality of blades while maintaining a respective centroid of the plurality of blades on a common circumference around the common rotating axis.

Another aspect provides an electronic device, comprising: a processor; a fan operatively coupled to the processor and comprising: a hub for connection to a motor; and a plurality of blades coupled to the hub, the plurality of blades being mutually diverging from the hub and spaced apart around a common rotating axis, with each of the plurality of blades defining a centroid, wherein at least one blade of the plurality of blades is deviated with respect to a corresponding centroid of the at least one blade to provide a non-uniform arrangement of the plurality of blades while maintaining a respective centroid of the plurality of blades on a common circumference around the common rotating axis.

A further aspect provides a method of manufacturing a fan, comprising: coupling a plurality of blades to a hub, the hub being for connection to a motor, and the plurality of blades being mutually diverging from the hub and spaced apart around a common rotating axis, with each of the plurality of blades defining a centroid, deviating at least one blade of the plurality of blades with respect to a corresponding centroid of the at least one blade to provide a non-uniform arrangement of the plurality of blades while maintaining a respective centroid of the plurality of blades on a common circumference around the common rotating axis.

The foregoing is a summary and thus may contain simplifications, generalizations, and omissions of detail; consequently, those skilled in the art will appreciate that the summary is illustrative only and is not intended to be in any way limiting.

For a better understanding of the embodiments, together with other and further features and advantages thereof, reference is made to the following description, taken in conjunction with the accompanying drawings. The scope of the invention will be pointed out in the appended claims.

DETAILED DESCRIPTION

It will be readily understood that the components of the embodiments, as generally described and illustrated in the figures herein, may be arranged and designed in a wide variety of different configurations in addition to the described example embodiments. Thus, the following more detailed description of the example embodiments, as represented in the figures, is not intended to limit the scope of the embodiments, as claimed, but is merely representative of example embodiments.

Reference throughout this specification to "one embodiment" or "an embodiment" (or the like) means that a particular feature, structure, or characteristic described in connection with the embodiment is included in at least one embodiment. Thus, the appearance of the phrases "in one embodiment" or "in an embodiment" or the like in various places throughout this specification are not necessarily all referring to the same embodiment.

Furthermore, the described features, structures, or characteristics may be combined in any suitable manner in one or more embodiments. In the following description, numerous specific details are provided to give a thorough understanding of embodiments. One skilled in the relevant art will recognize, however, that the various embodiments can be practiced without one or more of the specific details, or with other methods, components, materials, et cetera. In other instances, well known structures, materials, or operations are not shown or described in detail to avoid obfuscation.

An embodiment of the present application provides a fan, comprising: a hub for connection to a motor; a plurality of blades coupled to the hub, the blades diverging mutually and spaced apart around a common rotating axis, and each blade defining a centroid. In particular, at least one of the plurality of blades is deviated with respect to the corresponding centroid to provide a non-uniform arrangement of the plurality of blades whilst maintaining the respective centroids of the blades on a circumference around the common rotating axis. Specifically, an included angle between an end radius of the blade in the fan and that of a reference blade corresponding to the blade is a first included angle, and the first included angles corresponding to the blades are not all the same. Namely, the blades are asymmetrically or non-uniformly arranged, which can avoid resonance of the blades and be beneficial to improving the performance of the fan and prolonging its service life. An embodiment further provides an electronic device equipped with the fan, which is good in performance and long in service life.

Figure 1:
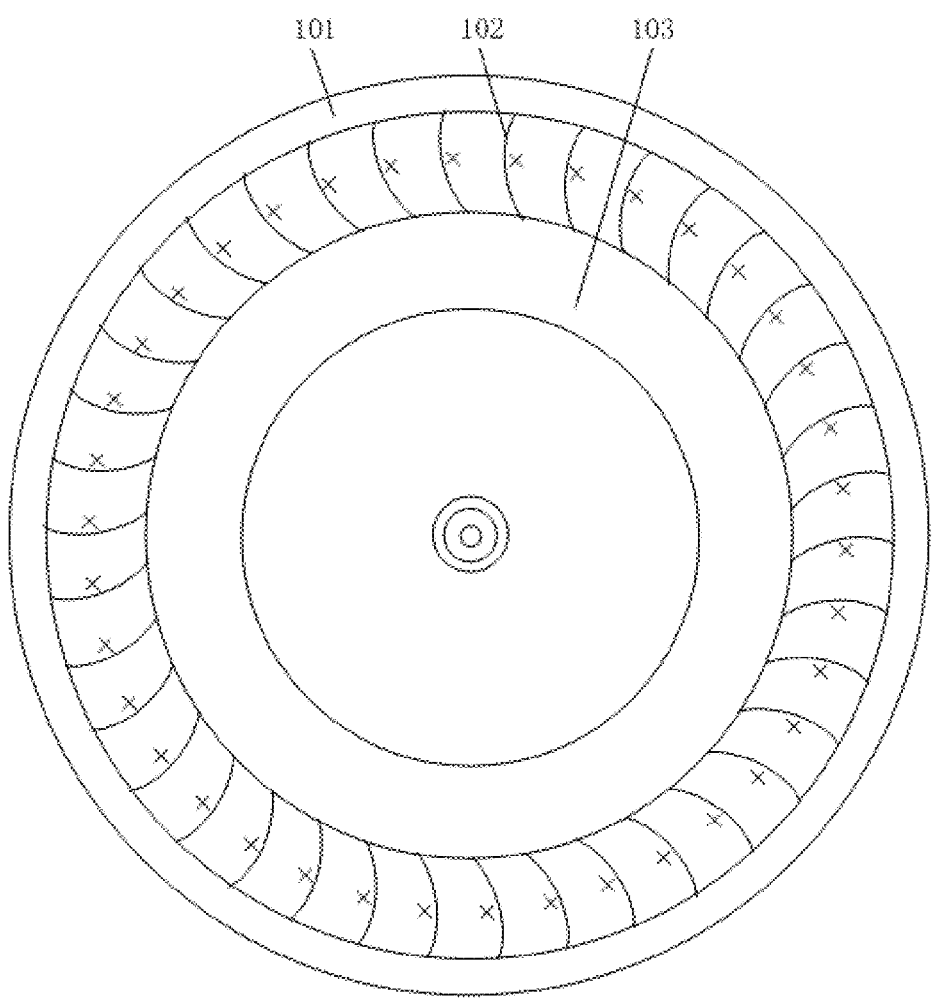
FIG. 1 is a structural diagram of a fan in an embodiment.
Figure 2:
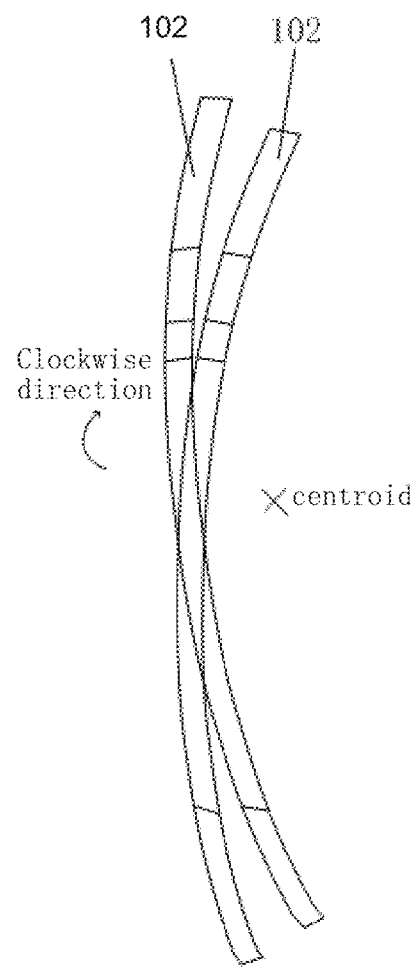
FIG. 2 is a schematic diagram of a blade in an embodiment, while the blade rotates clockwise from the position of a reference blade corresponding to the blade.
Figure 3:
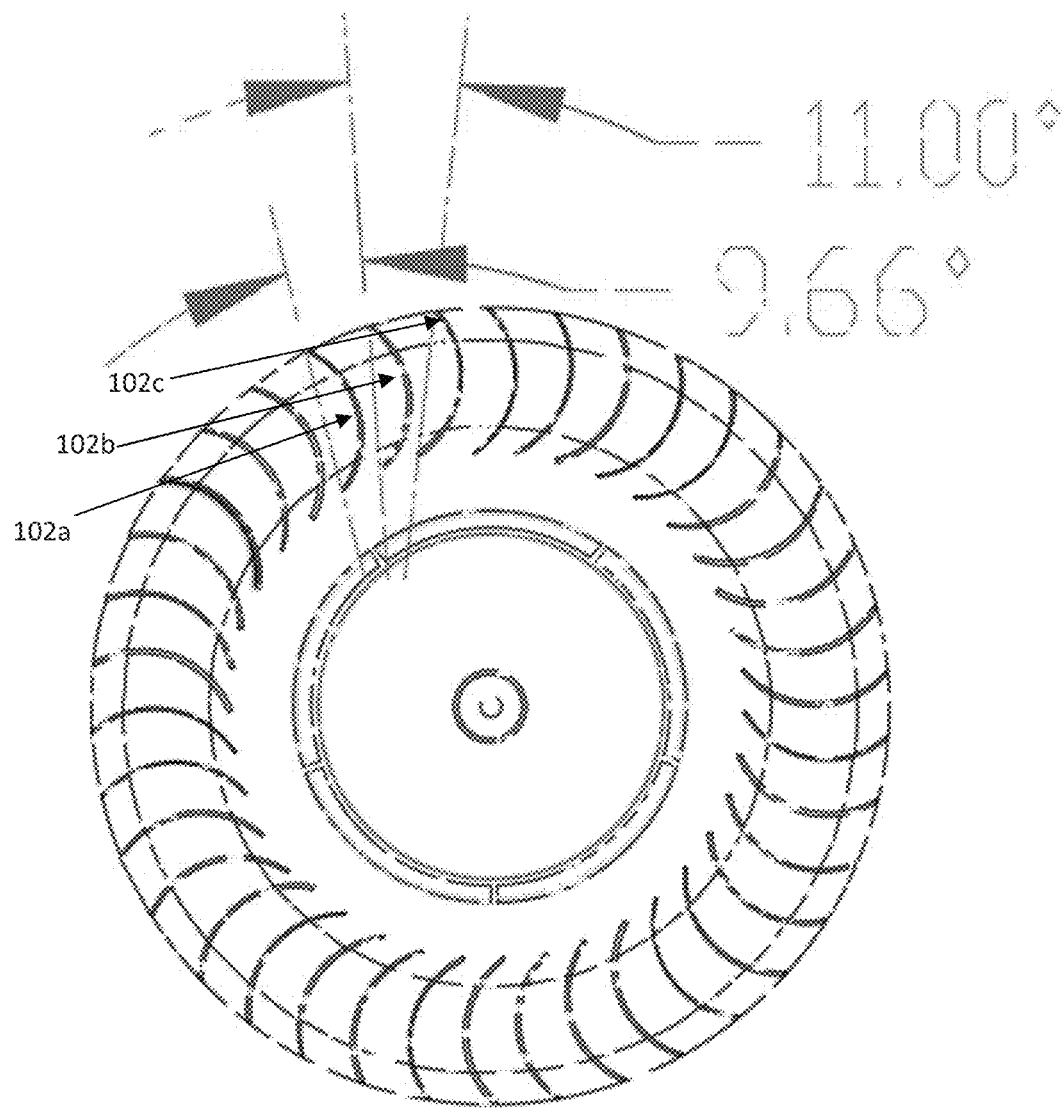
FIG. 3 shows a further embodiment of a fan having blades that are asymmetrically arranged.

Referring to FIGS. 1, 2 and 3, the embodiments provide a fan comprising a plurality of blades 102, where the blades 102 rotate around a rotating axle when the fan works. The centroids of the blades 102 are configured on the same circumference. A first plane where the circumference is located is perpendicular to the rotating axle, and the circle center of the circumference is located on the rotating axle. The blades 102 are distributed in such a way that one end of the blade 102 faces the circle center while the other end of the blade 102 is far away from the circle center of the circumference. The end, facing the circle center, of the blade 102, is a first end while the other end of the blade is a second end, and a connecting line between the first end of the blade and the centroid of the blade 102 is an end radius. An included angle between the end radius of the blade 102 and that of the reference blade 102 corresponding to the blade 102 is a first included angle; and the first included angles corresponding to the blades 102 are not all the same.

The centroid of the blade 102 is a location where the volume of the blade 102 is assumed to be concentrated. As the blade 102 is generally comprised of a uniform density, the centroid of the blade 102 is typically also the center of gravity of the blade 102. This is a location through which the whole weight of the blade 102 acts.

The reference blades 102 corresponding to the blades 102 are blades 102 formed after the overall design of the fan. During the design process of the fan, the shapes of the single blades 102 should be designed according to actual working demands at first and then the overall structural design of the fan is implemented according to the actual working demands. Blades 102 in a fan in the prior art are arranged symmetrically after the overall design of the fan, and symmetric arrangement means that any blade 102 can be overlapped with the other blades 102, respectively, after being rotated for different angles around the rotating axle.

Thereafter, an asymmetrical blade arrangement of the fan may be achieved by rotating one or more of the blades 102 about the corresponding centroid(s), as shown in FIG. 2, whilst ensuring that the respective centroids of the blades 102 are located on the same circumference on a plane. It should be appreciated that the one or more blades 102 may be rotated either in a clockwise or anti-clockwise direction, although FIG. 2 shows the blade 102 being rotated in a clockwise direction about its centroid.

Optionally, an asymmetrical blade arrangement of the fan may also be achieved by rotating the end radius of one or more of the blades 102 about the corresponding centroids(s) along the plane on which the respective centroids of the blades 102 are located, as shown in FIG. 3. In particular, FIG. 3 shows blades 102a, 102b and 102c having different included angles—blade 102a and blade 102b has an included angle of 9.66 degrees, whereas blade 102b and blade 102c has an included angle of 11.00 degrees. Although the rotations of one or more blades 102 shown in FIG. 2 and FIG. 3 define an orthogonal relationship, it should be appreciated that other relationships may also be possible.

In the fan in the embodiments, the first included angles corresponding to the blades 102 are not all the same. Blades 102 that cannot be overlapped with other blades 102 after being rotated for any angle around the rotating axle exist in the blades 102, namely the blades 102, are asymmetrically distributed, which can avoid resonance of the blades 102 during the application process of the fan and be beneficial to improving the performance of the fan and prolonging its service life.

Particularly, in the fan, some of the first included angles corresponding to the blades 102 can be set to be the same while the others are set to be different. In an embodiment, preferably all the first included angles corresponding to the blades 102 are different. The first included angle is set as a random angle within the first preset angle range to make sure the fan works properly and satisfies the practical working conditions such as air quantity of the fan. In specific settings, a set of random angles may be taken within the first preset angle range (the number of angles in the set of the random angles is the same as that of the blades 102), such that the blade 102 rotates for one random angle around a centroid of the reference blade 102 from the position of the reference blade 102. The angles in the random angle sets and the blades 102 are in one-to-one correspondence.

Specifically, in the fan in the embodiments, the range of the first preset angle is set as minus 3 degrees to 3 degrees, if the random angle is a negative value, it is indicated that the blade 102 is rotated in a counterclockwise direction from the position of the reference blade 102. If the random angle is a positive value, it is indicated that the blade 102 is rotated in a clockwise direction from the position of the reference blade 102. The plane where a clockwise and a counterclockwise rotation take place is perpendicular to the rotating axle.

Further, the first preset angle range is set as 0 degrees to 1 degree even though the blade 102 only rotates for a small angle from the reference blade 102 to prevent resonance of the blades 102 and to make sure the distribution of the blades 102 in the fan can satisfy the requirements of the practical working conditions.

In the fan in the embodiments, the centroids of the blades 102 are uniformly configured on the circumference, such that the blades 102 can be enabled to keep balanced in the application process.

Preferably, in the fan in the embodiments, an even number of blades 102 are provided. As compared with a fan having an odd number of blades 102, the fan in the embodiment further eases foundry production, extra lift pins are left out, the blades 102 are not required to be extended, neither are slag ladles to be provided, and an unnecessary operation of cutting the blades 102 is avoided following demolding.

In the fan, a first end of the blade 102 is fixed to the central disc 103 of the fan and a second end of the blade 102 is fixed on the mute ring 101 of the fan. The central disc 103 and the mute ring 101 share the same center point which is located on the rotating axle of the blades 102. The disc plane of the central disc 103 and the end faces of the mute ring 101 are parallel to the first plane respectively. The mute ring 101 surrounds the outside of the central disc 103, and a gap is formed between the mute ring 101 and the central disc 103. The blades 102 span the gap.

Specifically, in the fan in the embodiments, the mute ring 101 is a circular ring and the blade 102 is an arc blade curved from the first end to the second end. The central disc 103 is disc-shaped.

In the fan in the embodiments, the blades 102, the central disc 103 and the mute ring 101 are an integrated structured and are produced by means of casting.

Embodiments of the present invention also provide an electronic device, and the electronic device includes a fan which is the fan provided in the embodiments.

The electronic device applies the fan and has the effects of good fan performance and long service life. In addition, the electronic device also has other effects relevant to the fan in the embodiments, so the detailed description thereof will be omitted.

It should be noted that various embodiments are all described in a progressive way, with an emphasis of each embodiment on the differences from other embodiments, and the same and similar parts among the embodiments can be seen from cross references.

Finally, also it should be specified, such relational terms as the "first" and "second" are used solely to distinguish one entity or operation from another entity or operation, without necessarily requiring or implying that any of the actual relations or orders exists among such entities or operations. Furthermore, the terms "comprises," "comprising" or any other variation thereof, are intended to cover a non-exclusive inclusion, such that a process, a method, an article, or a device which comprise a series of elements not only comprise the elements but also comprise other elements which are not expressly listed or comprise inherent elements of the process, the method, the article, or the device. An element defined by "comprises . . . a" does not, without more constraints, preclude the existence of additional identical elements in the process, the method, the article, or the device that comprise the elements.

This disclosure has been presented for purposes of illustration and description but is not intended to be exhaustive or limiting. Many modifications and variations will be apparent to those of ordinary skill in the art. The example embodiments were chosen and described in order to explain principles and practical application, and to enable others of ordinary skill in the art to understand the disclosure for various embodiments with various modifications as are suited to the particular use contemplated.

Thus, although illustrative example embodiments have been described herein with reference to the accompanying figures, it is to be understood that this description is not limiting and that various other changes and modifications may be affected therein by one skilled in the art without departing from the scope or spirit of the disclosure.

What is claimed is:

1. A fan, comprising:
a mute ring;
a hub for connection to a motor; and
a plurality of blades coupled to the hub, the plurality of blades being mutually diverging from the hub and spaced apart around a common rotating axis, wherein each of the plurality of blades defines a centroid and wherein one end of each of the plurality of blades is attached to the hub and wherein another end of each of the plurality of blades is attached to the mute ring;
wherein at least one blade of the plurality of blades is rotated about its corresponding centroid to provide a non-uniform arrangement of the at least one blade with another blade of the plurality of blades, wherein a common circumference around the common rotating axis is maintained between the centroid of the at least one blade and the centroid of the another blade and wherein the plurality of blades comprise a combination of clockwise rotated blades and counter clockwise rotated blades.

2. The fan according to claim 1, wherein each of the plurality of blades is deviated differently.

3. The fan according to claim 2, wherein a deviation of a blade of the plurality of blades is a random angle within a first preset angle range.

4. The fan according to claim 3, wherein the first preset angle range is minus 3 degrees to 3 degrees.

5. The fan according to claim 1, wherein centroids of the plurality of blades are uniformly configured on the common circumference.

6. The fan according to claim 1, wherein an even number of the plurality of blades are provided.

7. The fan according to claim 1, wherein both ends of each of the plurality of blades are respectively fixed on a central disc and the mute ring of the fan;
wherein the central disc has a center located on a rotating axle of the plurality of blades and the mute ring surrounds the outside of the central disc, and a gap is formed between the mute ring and the central disc.

8. The fan according to claim 7, wherein the plurality of blades, the central disc and the mute ring are formed of an integrated structure.

9. An electronic device, comprising:
a mute ring;
a processor;
a fan operatively coupled to the processor and comprising:
a hub for connection to a motor; and
a plurality of blades coupled to the hub, the plurality of blades being mutually diverging from the hub and spaced apart around a common rotating axis, wherein each of the plurality of blades defines a centroid and wherein one end of each of the plurality of blades is attached to the hub and wherein another end of each of the plurality of blades is attached to the mute ring;
wherein at least one blade of the plurality of blades is rotated about its corresponding centroid to provide a non-uniform arrangement of the at least one blade with another blade of the plurality of blades, wherein a common circumference around the common rotating axis is maintained between the centroid of the at least one blade and the centroid of the another blade and wherein the plurality of blades comprise a combination of clockwise rotated blades and counter clockwise rotated blade wherein each of the plurality of blades is not symmetrical with another of the plurality of blades.

10. A method of manufacturing a fan, comprising:
coupling a plurality of blades to a hub, the hub connectable to a motor, wherein the plurality of blades are mutually diverging from the hub and spaced apart around a common rotating axis, wherein each of the plurality of blades defines a centroid and wherein one end of each of the plurality of blades is attached to the hub and wherein another end of each of the plurality of blades is attached to a mute ring;
rotating at least one blade of the plurality of blades about its corresponding centroid to provide a non-uniform arrangement of the at least one blade with another blade of the plurality of blades, wherein a common circumference around the common rotating axis is maintained between the centroid of the at least one blade and the centroid of the another blade and wherein the plurality of blades comprise a combination of clockwise rotated blades and counter clockwise rotated blades.

11. The method according to claim 10, wherein each of the plurality of blades is deviated differently.

12. The method according to claim 11, wherein a deviation of a blade of the plurality of blades is a random angle within a first preset angle range.

13. The method according to claim 12, wherein the first preset angle range is minus 3 degrees to 3 degrees.

14. The method according to claim 10, characterized in that the centroids of the plurality of blades are uniformly configured on the common circumference.

* * * * *